US008861564B2

(12) United States Patent
Nagatomo et al.

(10) Patent No.: US 8,861,564 B2
(45) Date of Patent: Oct. 14, 2014

(54) DISTRIBUTED FEEDBACK SURFACE EMITTING LASER

(75) Inventors: Yasuhiro Nagatomo, Kawasaki (JP); Takeshi Kawashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/444,118

(22) Filed: Apr. 11, 2012

(65) Prior Publication Data

US 2012/0269224 A1    Oct. 25, 2012

(30) Foreign Application Priority Data

Apr. 21, 2011    (JP) ................................. 2011-095116

(51) Int. Cl.
| | |
|---|---|
| *H01S 3/08* | (2006.01) |
| *H01S 5/10* | (2006.01) |
| *H01S 5/343* | (2006.01) |
| *H01S 5/20* | (2006.01) |
| *H01S 5/042* | (2006.01) |
| *H01S 5/18* | (2006.01) |
| *H01S 5/065* | (2006.01) |

(52) U.S. Cl.
CPC ............. *H01S 5/105* (2013.01); *H01S 5/34333* (2013.01); *H01S 5/2022* (2013.01); *H01S 5/2031* (2013.01); *H01S 5/0425* (2013.01); *H01S 5/18* (2013.01); *H01S 5/0655* (2013.01)
USPC ...................... 372/96; 372/50.11; 372/50.124; 372/50.1

(58) Field of Classification Search
USPC .......................... 372/96, 50.11, 50.124, 50.1
See application file for complete search history.

(56) References Cited

U.S. PATENT DOCUMENTS

| | | | | |
|---|---|---|---|---|
| 5,533,041 A | * | 7/1996 | Matsuda et al. | ............. 372/50.1 |
| 5,559,053 A | * | 9/1996 | Choquette et al. | ............. 438/41 |
| 2008/0285608 A1 | * | 11/2008 | Hori | .......................... 372/44.011 |
| 2012/0049156 A1 | * | 3/2012 | Ohta et al. | ....................... 257/13 |

FOREIGN PATENT DOCUMENTS

| | | |
|---|---|---|
| JP | 10-284806 A | 10/1998 |
| JP | 2000-332351 A | 11/2000 |
| JP | 2008-311625 A | 12/2008 |
| JP | 2009-212359 A | 9/2009 |
| JP | 2010-093127 A | 4/2010 |
| JP | 2010-245178 A | 10/2010 |

* cited by examiner

*Primary Examiner* — Kinam Park
(74) *Attorney, Agent, or Firm* — Canon USA, Inc. IP Division (57) ABSTRACT

A photonic crystal surface emitting laser array reduces the occurrence of reflected feedback light while also reducing input of leaking light. The photonic crystal surface emitting laser array includes a plurality of first photonic crystal regions that cause laser oscillation, a second photonic crystal region that causes light diffraction to occur in an out-of-plane direction, and a light absorber that is provided above the second photonic crystal region and that absorbs light having a wavelength λ. A radiation coefficient of each first photonic crystal region is smaller than a radiation coefficient of the second photonic crystal region.

20 Claims, 8 Drawing Sheets

DISTRIBUTED FEEDBACK SURFACE EMITTING LASER

BACKGROUND OF THE INVENTION

1. Field of the Invention

One disclosed aspect of the embodiments relates to distributed feedback surface emitting lasers that use photonic crystals.

2. Description of the Related Art

In recent years, there have been many reports that discuss examples of semiconductor lasers to which photonic crystals are applied. Japanese Patent Laid-Open No. 2000-332351 discloses a surface emitting laser in which a two-dimensional photonic crystal (two-dimensional diffraction grating) is disposed near an active layer formed on a substrate and containing a light-emitting material. This is a type of a distributed feedback surface emitting laser (DFB surface emitting laser). The two-dimensional photonic crystal is periodically provided with cylindrical air holes in a semiconductor layer and has two-dimensionally periodical refractive-index distribution.

Light generated in the active layer is second-order diffracted due to the periodical refractive-index distribution in the photonic crystal while being guided in an in-plane direction of the active layer so as to form a standing wave, which is a resonant mode, at a specific wavelength $\lambda$, thereby causing laser oscillation. This laser-oscillated light undergoes first-order diffraction by the photonic crystal so as to change its propagation direction to a direction perpendicular to the plane of the active layer before the light is output from the surface of the laser structure.

Since this phenomenon occurs in the entire area of the photonic crystal, the semiconductor laser discussed in Japanese Patent Laid-Open No. 2000-332351 operates as a surface emitting laser that outputs two-dimensional coherent light. One characteristic feature of this laser structure is that the direction in which the light is guided near the active layer and the direction in which the light is output from the laser structure are perpendicular to each other.

In addition to this laser structure, a surface emitting laser structure that uses a photonic crystal in a vertical cavity surface emitting laser (VCSEL) is also known. Japanese Patent Laid-Open No. 10-284806 discloses a VCSEL that suppresses spontaneous emission of light by using a two-dimensional photonic crystal so as to allow for low power consumption operation with a low threshold value.

Unlike the aforementioned DFB-type photonic crystal surface emitting laser, the direction in which the light is guided near the active layer and the direction in which the light is output from the laser structure are the same in this VSCEL-type photonic crystal surface emitting laser.

The term "photonic crystal surface emitting laser" used in this specification will be directed to a distributed feedback (DFB) surface emitting laser, unless otherwise noted.

As mentioned above, in a photonic crystal surface emitting laser, the resonating direction of light is oriented in the in-plane direction of the active layer. If the size of the photonic crystal in the in-plane direction of the active layer is limited, a phenomenon in which a portion of resonating light leaks out from the photonic crystal occurs. If multiple photonic crystal surface emitting lasers are arrayed on a single substrate, light leaking from one of neighboring photonic crystal surface emitting lasers may reach the other photonic crystal surface emitting laser, possibly having an adverse effect on the oscillation characteristics.

Japanese Patent Laid-Open No. 2010-093127 discloses a semiconductor light-emitting device in which multiple photonic crystal surface emitting lasers are arrayed on a single substrate. In this device, grooves are formed between the photonic crystal surface emitting lasers, and the surface of each groove is coated with a reflective film. With this configuration, input of leaking light from one photonic crystal surface emitting laser to another photonic crystal surface emitting laser may be suppressed, thereby achieving stable oscillation characteristics.

SUMMARY OF THE INVENTION

By using the structure disclosed in Japanese Patent Laid-Open No. 2010-093127 described above, input of leaking light from one photonic crystal surface emitting laser to another photonic crystal surface emitting laser may be reduced.

Figure 6:
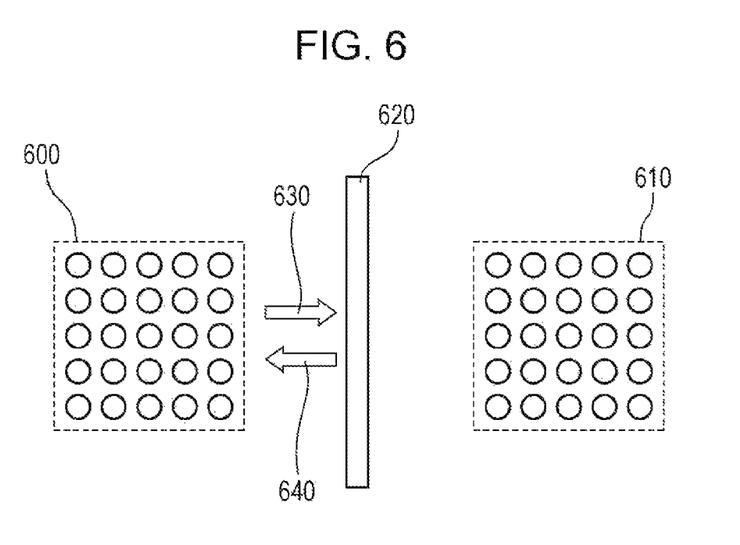
FIG. 6 is a schematic diagram for explaining a problem in a photonic crystal surface emitting laser in the related art.

However, this structure may possibly cause a new problem in that reflected feedback light may be generated at the grooves between the photonic crystal surface emitting lasers. Referring to FIG. 6, when a groove 620 is provided between two-dimensional photonic crystals 600 and 610, light 630 leaking from the photonic crystal 600 is reflected by the groove 620 so that feedback light 640 is generated. This feedback light 640 undesirably returns to the photonic crystal 600. This reflected feedback light may make the laser oscillation characteristics unstable.

In other words, in order for the semiconductor light-emitting device having the array of photonic crystal surface emitting lasers on the single substrate to operate more stably, a structure that not only reduces input of leaking light but may also reduce reflected feedback light is desired.

One disclosed aspect of the embodiments provides a photonic crystal surface emitting laser array that reduces the occurrence of reflected feedback light while also reducing input of leaking light.

A distributed feedback surface emitting laser according to an aspect of the embodiments oscillates at a wavelength $\lambda$ and includes an active layer and a photonic crystal on a substrate, the photonic crystal having a resonant mode in an in-plane direction of the active layer. The distributed feedback surface emitting laser includes a plurality of first photonic crystal regions and a second photonic crystal region that are provided on the substrate, and a light absorber. The first photonic crystal regions cause laser oscillation, and the second photonic crystal region is provided between the first photonic crystal regions and causes light diffraction to occur in an out-of-plane direction. The light absorber is provided above the second photonic crystal region and absorbs light having the wavelength $\lambda$. A radiation coefficient of each first photonic crystal region is smaller than a radiation coefficient of the second photonic crystal region.

According to the embodiments, a photonic crystal surface emitting laser array that reduces the occurrence of reflected feedback light while also reducing input of leaking light may be provided.

Further features of the embodiments will become apparent from the following description of exemplary embodiments with reference to the attached drawings.

DESCRIPTION OF THE EMBODIMENTS

A configuration example of a photonic crystal surface emitting laser according to an embodiment will now be described. Specifically, the photonic crystal surface emitting laser is a type of a distributed feedback surface emitting laser and includes an active layer and a photonic crystal provided near the active layer and having periodical refractive-index distribution.

The photonic crystal surface emitting laser according to the embodiment includes first photonic crystal regions and a second photonic crystal region. The first photonic crystal regions are disposed at multiple locations on a single substrate, and the second photonic crystal region is disposed between the first photonic crystal regions.

Although each photonic crystal region includes a photonic crystal, the photonic crystal region in this specification is directed not only to a layer provided with the photonic crystal, but also to structures above and below the photonic crystal.

In this specification, a substrate side of a laser device will be defined as a lower side, whereas a side opposite the substrate side will be defined as an upper side.

First Photonic Crystal Regions

Each of the first photonic crystal regions is designed so as to cause laser oscillation. Specifically, each first photonic crystal region includes an active layer, a first photonic crystal serving as a cavity, and electrodes for electric-current injection. The first photonic crystal has a resonant mode at a laser oscillation wavelength λ in an in-plane direction of the active layer.

The pitch (lattice constant) of refractive-index modulation in the first photonic crystal is designed such that the first photonic crystal serves as a diffraction grating of a second order or higher at the laser oscillation wavelength. As a diffraction grating of a second order or higher, the first photonic crystal may function as a cavity in the distributed feedback (DFB) surface emitting laser. Furthermore, the first photonic crystal is desirably a diffraction grating of an even-numbered order so that laser light is radiated in a direction perpendicular to the plane. It is most desirable that the first photonic crystal be a second-order diffraction grating so that radiation does not occur in undesired directions other than in the direction perpendicular to the plane.

In order to make the first photonic crystal into a second-order diffraction grating, the first photonic crystal is designed such that a value obtained by multiplying the lattice constant of the photonic crystal by an effective refractive index is equal to a desired laser oscillation wavelength. By adjusting a gain region of the active layer to the aforementioned wavelength, laser oscillation is brought about at that wavelength.

Second Photonic Crystal Region

The second photonic crystal region is designed so as not to cause laser oscillation. The occurrence of laser oscillation may be prevented by not forming an active layer or by not injecting electric current.

The role of the second photonic crystal region is to convert the traveling direction of light leaking from each first photonic crystal region in the in-plane direction of the active layer to upward and downward out-of-plane directions by diffraction. In order to cause the diffraction in the out-of-plane directions, the second photonic crystal region needs to be a diffraction grating of a second order or higher.

The light diffracted downward by the second photonic crystal region travels to the substrate, whereas the light diffracted upward is absorbed by a light absorber, to be described later.

If the second photonic crystal region is sufficiently large, a major portion of the light leaking from each first photonic crystal region in the in-plane direction of the active layer is diffracted upward and downward by the second photonic crystal region so as not to reach another neighboring first photonic crystal region. Since this configuration has no steep interfaces that cause light reflection, such as grooves, reflected feedback light, as previously described with reference to FIG. 6, is less likely to occur. Therefore, with the second photonic crystal region provided between the first photonic crystal regions, the light leaking from each first photonic crystal region may be prevented from reaching another neighboring first photonic crystal region, and the occurrence of reflected feedback light may be reduced.

Light Absorber

In the photonic crystal surface emitting laser according to an embodiment, a light absorber is disposed at the upper side of the second photonic crystal region. A material that may be used for the light absorber may absorb light with a wavelength that causes laser oscillation. For example, the material may be metal.

If metal is used as the light absorber, a portion of an electric wire for applying electric current to the photonic crystal surface emitting laser may be used as the light absorber.

If the light absorber is not provided, the light diffracted upward by the second photonic crystal region would be radiated from the device surface so as to become stray light, which may adversely affect the laser characteristics.

Radiation Coefficient of Each Photonic Crystal Region

In order to achieve the advantages of the embodiments, the first photonic crystal regions and the second photonic crystal region according to an embodiment have different optimal radiation coefficients.

The radiation coefficient of each photonic crystal region is a proportion of light, which is radiated in the out-of-plane directions due to diffraction while being guided in a unit length, in light existing as a guided mode in the photonic crystal.

Since laser oscillation needs to be generated in each first photonic crystal region, it is desirable that a loss be as small as possible so that light oscillation may be generated at a low threshold value. Since a large radiation coefficient leads to a large loss, the radiation coefficient of each first photonic crystal region needs to be small.

On the other hand, since laser oscillation does not need to be generated in the second photonic crystal region, it is not necessary to take into account a large loss. Actually, a larger radiation coefficient allows for attenuation of leaking light within a shorter distance. Consequently, since the occurrence of crosstalk may be reduced even when the distance between the first photonic crystal regions is small, this configuration is suitable for use in a narrow-pitch array.

Due to the above reasons, regarding the radiation coefficient of each first photonic crystal region, an optimal value varies depending on a desired oscillation threshold value or desired output level of light, meaning that the radiation coefficient should not be increased unconditionally. On the other hand, it is desirable that the radiation coefficient of the second photonic crystal region be increased as much as possible. Therefore, in order to sufficiently exhibit the intended advantages of the embodiments, it is desirable that the radiation coefficient of the second photonic crystal region be larger than the radiation coefficient of each first photonic crystal region.

Relationship Between Structure of Photonic Crystal and Radiation Coefficient

A radiation coefficient may be varied by varying the structure of a photonic crystal. For example, the radiation coefficient may be varied by varying the depth of holes, the radius of the holes, the shape of the holes, or the structure of a layer adjacent to the photonic crystal.

First, the following description relates to an example in which the radiation coefficient is varied by varying the depth of the holes.

Figure 7:
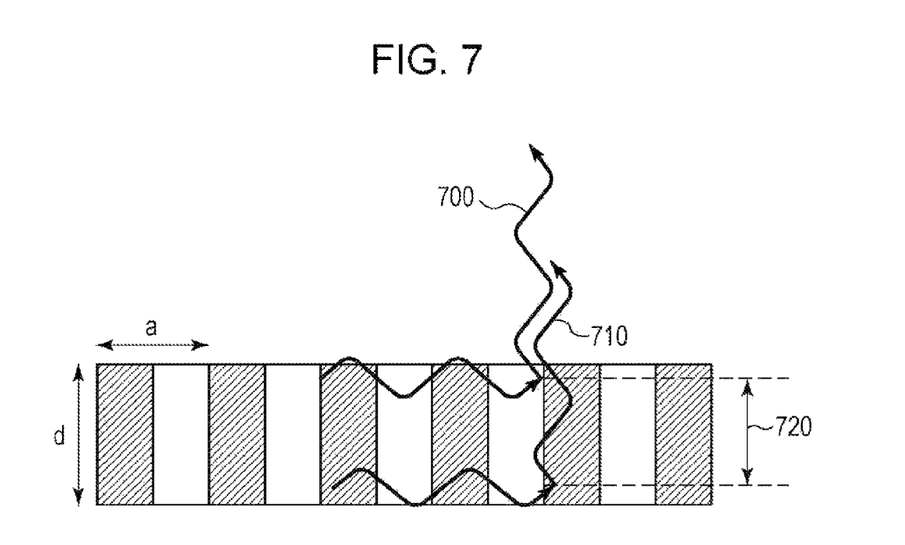
FIG. 7 schematically illustrates how light is diffracted in an out-of-plane direction from a photonic crystal.

FIG. 7 schematically illustrates diffraction of light by the photonic crystal, showing how the light is diffracted in a direction perpendicular to the plane from a two-dimensional photonic crystal having a lattice constant a.

Since diffraction may occur at any position in the thickness direction within the photonic crystal, when the diffraction occurs at different positions, as with diffracted light rays 700 and 710 in FIG. 7, a light path difference 720 occurs in the light radiated in the direction perpendicular to the plane. Because these light rays interfere with each other so as to intensify or weaken each other, radiation is readily made to occur. In other words, the radiation coefficient is affected.

Figure 8:
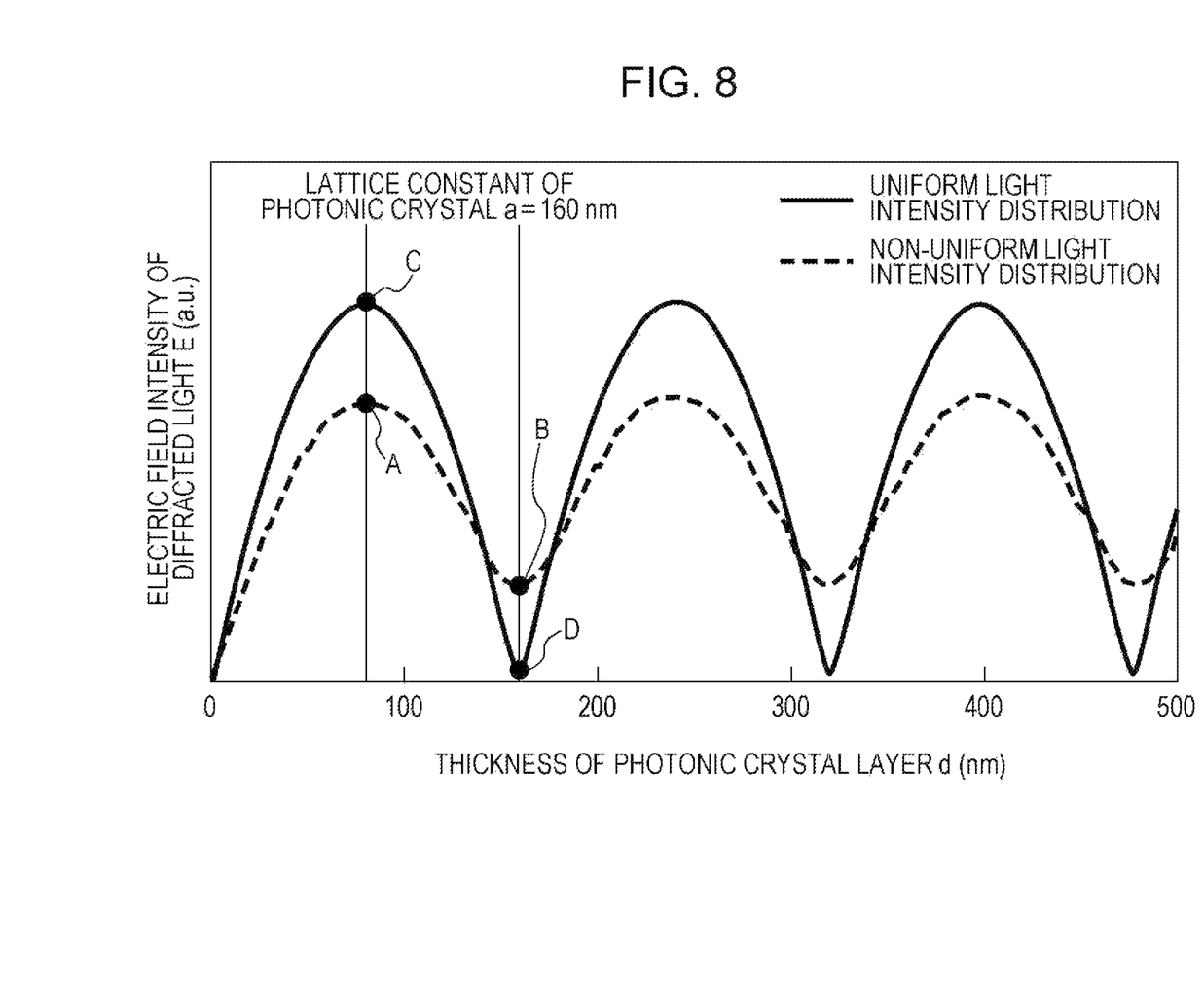
FIG. 8 illustrates the relationship between the thickness of the photonic crystal and the intensity of light radiated in the out-of-plane direction from the photonic crystal.

Whether the entire light to be radiated is intensified or weakened due to the interference is determined by a thickness d of the photonic crystal. FIG. 8 illustrates the relationship between the thickness of the photonic crystal and the intensity of light diffracted and radiated outward from the photonic crystal shown in FIG. 7. The solid line indicates a calculation result corresponding to a case where the light intensity distribution within the two-dimensional photonic crystal in the thickness direction thereof is uniform. The dotted line indicates a calculation result corresponding to a case where the light intensity distribution within the two-dimensional photonic crystal is attenuated exponentially in the thickness direction. As the thickness d of the two-dimensional photonic crystal increases from zero, the diffracted light rays intensify each other until a certain thickness is reached. When the thickness d is equal to 0.5a, the intensity of diffracted light is at maximum. As the thickness is further increased, the diffracted light rays start to weaken each other so that the intensity of diffracted light begin to decrease. When the thickness d of the two-dimensional photonic crystal is equal to a, the intensity of diffracted light is at minimum. From then on, the diffracted light rays repeatedly intensify each other and weaken each other every time the thickness changes by 0.5a.

Specifically, the diffracted light rays intensify each other the most when the thickness d of the photonic crystal layer has the following relationship with the lattice constant a of the two-dimensional photonic crystal: $d=(0.5+p) \times a$. In contrast, the diffracted light rays weaken each other the most when $d=q \times a$. In this case, $(p=0, 1, 2, \ldots)$ and $(q=1, 2, 3, \ldots)$.

Accordingly, because the radiation coefficient varies in accordance with the thickness of the photonic crystal, the radiation coefficient may be given in-plane distribution by providing in-plane distribution in the thickness of the photonic crystal.

The following description relates to an example in which the radiation coefficient is varied by varying the radius of the holes.

A coupling coefficient is known as an indicator for indicating how readily diffraction occurs in a diffraction grating. The rate of occurrence of diffraction within the photonic crystal is related to the magnitude of the coupling coefficient. Diffraction tends to occur more readily with increasing absolute value of the coupling coefficient. It is known that the magnitude of a coupling coefficient with respect to first-order diffraction is correlated with the radiation coefficient. In other words, the radiation coefficient has a tendency to increase with increasing coupling coefficient with respect to first-order diffraction.

Figure 9:
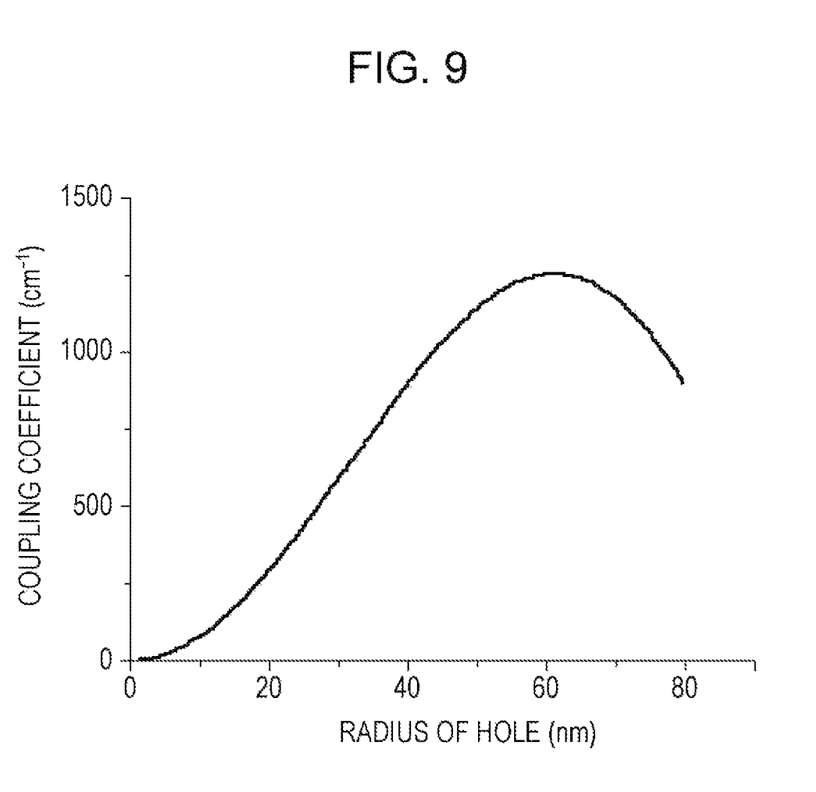
FIG. 9 illustrates the relationship between the radius of holes in the photonic crystal and a coupling coefficient with respect to first-order diffraction.

FIG. 9 illustrates an example of a calculation result indicating the relationship between the radius of the holes in the two-dimensional photonic crystal and the coupling coefficient with respect to first-order diffraction.

It may be understood from the drawing that the value of coupling coefficient is dependent on the radius of the holes, such that the coupling coefficient increases as the radius of the holes increases from zero, but starts to decrease when a certain radius or larger is reached. In this calculation result, the coupling coefficient is at maximum when the radius of the holes is about 40% of the lattice constant.

As described above, since the coupling coefficient with respect to first-order diffraction is correlated with the radiation coefficient, the radiation coefficient may be varied by varying the radius of the holes. Furthermore, the radiation coefficient may be given in-plane distribution by providing in-plane distribution in the radius of the holes.

Relationship Between Layer Adjacent to Photonic Crystal and Radiation Coefficient As described above, the radiation coefficient may be varied in a freely-chosen manner by varying the structure of the photonic crystal. However, it is sometimes difficult to provide in-plane distribution in the structure of the photonic crystal. For example, when the radius of the holes is varied, the depth of the holes may also sometimes be varied due to a microloading effect during a dry etching process. In that case, it may be difficult to achieve a desired hole depth for different hole radii.

Figure 1:
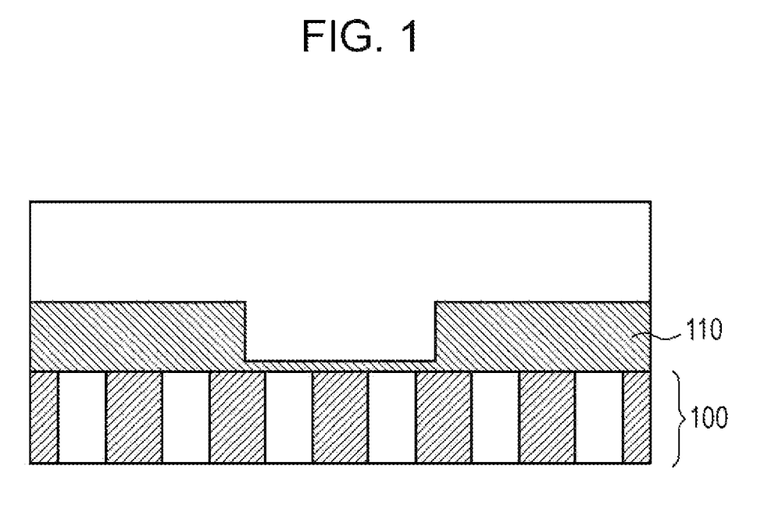
FIG. 1 is a cross-sectional view of a photonic crystal surface emitting laser according to an embodiment.

In this case, as shown in FIG. 1, the radiation coefficient may be varied by varying the thickness of a layer 110 adjacent to a photonic crystal 100, instead of varying the thickness of the photonic crystal 100. The layer 110 adjacent to the photonic crystal 100 is provided for controlling the light intensity distribution within the photonic crystal 100 and will be referred to as "light intensity distribution control layer". By varying the thickness of the light intensity distribution control layer 110 within the plane, the strength of interference between diffracted light rays is varied, thereby giving intensity distribution to the diffracted light rays.

The purpose for providing the light intensity distribution control layer 110 is to control the uniformity of light intensity distribution within the photonic crystal 100. As shown in FIG. 8, the intensity of diffracted light varies between a case where the light intensity distribution within the photonic crystal in the thickness direction thereof is uniform and a case where the light intensity distribution is not uniform. The degree of interference is greater in the case where the light intensity distribution is uniform, so that a modulation width may be increased.

For example, when comparing point A and point C in FIG. 8, point C with uniform light intensity distribution has greater diffracted light intensity than point A with non-uniform light intensity distribution. On the other hand, when comparing point B and point D, point B with non-uniform light intensity distribution has greater diffracted light intensity.

Generally, the light intensity distribution within the photonic crystal surface emitting laser has a peak point near the active layer and gradually decreases with increasing distance therefrom.

The light intensity distribution control layer 110 is composed of a material with a refractive index higher than an average refractive index of the photonic crystal. Generally, the light intensity distribution tends to concentrate in an area with a high refractive index. By disposing the light intensity distribution control layer 110 at the opposite side of the active layer relative to the photonic crystal, the light intensity distribution extends as if it is pulled toward the light intensity distribution control layer 110, so that the light intensity distribution within the photonic crystal in the thickness direction thereof is made more uniform. As a result, the diffracted light intensity is affected, as mentioned above.

Because the degree of uniformity of light intensity distribution within the photonic crystal changes when the refractive index or the thickness of the light intensity distribution control layer 110 is varied, the diffracted light intensity also changes. In other words, even when the structure of the photonic crystal is the same, the degree of uniformity of light intensity distribution changes depending on the thickness of the light intensity distribution control layer 110 or whether or not the light intensity distribution control layer 110 is provided. Therefore, by providing in-plane distribution in the thickness of the light intensity distribution control layer 110, the radiation coefficient of the photonic crystal region may be provided with in-plane distribution. With this configuration, since the radiation coefficient may be controlled by simply controlling the thickness of the light intensity distribution control layer 110, the configuration is advantageous in that a fabrication process thereof is relatively easy.

Other Configuration Examples

As described above, since the depth of the holes, the radius of the holes, the shape of the holes, or the structure of the layer adjacent to the photonic crystal changes at the boundaries between the first photonic crystal regions and the second photonic crystal region, the effective refractive index for guided light may become non-continuous, sometimes causing a portion of the light to be reflected. In light of this, a continuously-changing structure may be provided instead of a sharply-changing structure so as to reduce the occurrence of reflection.

With regard to the photonic crystal structure used in the embodiments, the periodicity of the refractive index thereof may be one-dimensional or two-dimensional. For two-dimensional periodicity, a tetragonal lattice, a triangular lattice, or other generally-used lattice structures may be used.

The active layer in the laser structure in this embodiment may be of a type that is used in a typical semiconductor laser. One example is a multiple quantum well structure using a material such as GaAs/AlGaAs, GaInP/AlGaInP, or GaN/InGaN.

The surface emitting laser according to this embodiment may be driven on the basis of a photo-excitation method or a current injection method.

EXAMPLES

Examples of the embodiments will be described below.

First Example

As a first example, a configuration example of a photonic crystal surface emitting laser to which one embodiment is applied will be described with reference to FIG. 2.

Figure 2:
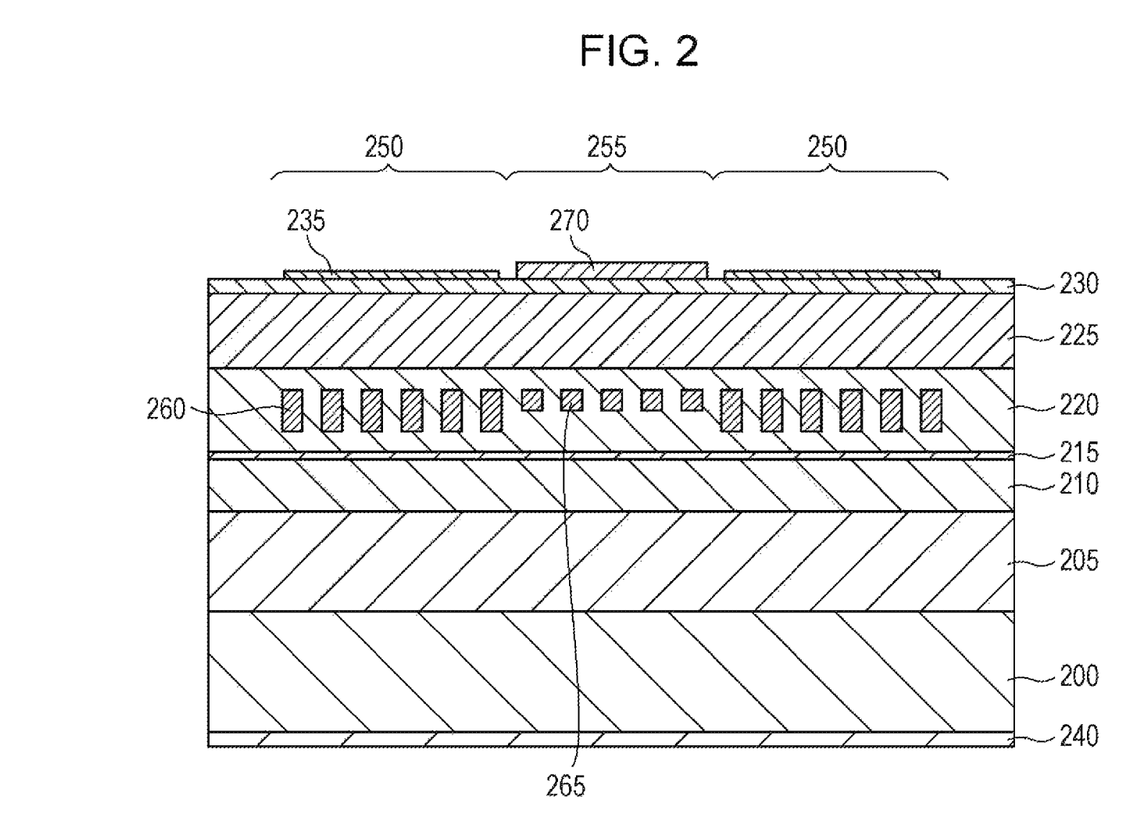
FIG. 2 is a cross-sectional view of a photonic crystal surface emitting laser according to a first example.

FIG. 2 is a schematic cross-sectional view for explaining a laser structure according to this example.

In this example, the radiation coefficient is varied by varying the depth of the holes.

The laser structure according to this example is designed so as to cause laser oscillation at a wavelength of 405 nm. An n-AlGaN cladding layer 205, an n-GaN guide layer 210, an active layer 215, a p-GaN layer 220, a p-AlGaN cladding layer 225, and a p$^+$-GaN layer 230 are stacked in that order on an n-type GaN substrate 200. The active layer 215 is formed of a three-period $In_{0.08}Ga_{0.92}N/In_{0.01}Ga_{0.99}N$ multiple quantum well.

P electrodes 235 composed of Ni and Au and an n electrode 240 composed of Ti and Al are disposed on the surfaces of the laser structure, and laser oscillation is generated in first photonic crystal regions 250 by injecting electric current from the p electrodes 235 and the n electrode 240.

A second photonic crystal region 255 is provided between the multiple first photonic crystal regions 250. Two-dimensional photonic crystals 260 and 265 are embedded within the p-GaN layer 220 of the first photonic crystal regions 250 and the second photonic crystal region 255, respectively. In each of the two-dimensional photonic crystals 260 and 265, cylindrical holes are two-dimensionally and periodically arrayed within the p-GaN layer 220. The lattice structure is a tetragonal lattice. The lattice constant a of each photonic crystal is 160 nm.

The two-dimensional photonic crystals 260 and 265 are embedded within the p-GaN layer 220 by a regret technique and patterning using dry etching and electron beam lithography. The upper surface of the second photonic crystal region 255 is provided with a light absorber 270 composed of gold.

The thickness of the two-dimensional photonic crystal 260 in each first photonic crystal region 250 is 160 nm, which is 1.0 times the lattice constant a of the photonic crystal 260.

The thickness of the two-dimensional photonic crystal 265 in the second photonic crystal region 255 is 80 nm, which is 0.5 times the lattice constant a of the photonic crystal 265.

For each first photonic crystal region 250, a thickness that allows for a reduced radiation coefficient is selected so as to reduce a laser-oscillation threshold value. For the second photonic crystal region 255, a thickness that allows for a maximum radiation coefficient is selected.

Although a portion of light laser-oscillated in each first photonic crystal region 250 is guided in the in-plane direction of the active layer 215 and leaks to the second photonic crystal region 255, the leaking light is diffracted upward and downward by the photonic crystal 265 in the second photonic crystal region 255. The light diffracted upward is absorbed by the light absorber 270. The light diffracted downward travels to the n-type GaN substrate 200 and is finally absorbed by the n electrode 240.

Accordingly, the light leaking from each first photonic crystal region 250 is prevented from reaching another neighboring first photonic crystal regions 250, thereby allowing for stable laser oscillation.

Second Example

Figure 3:
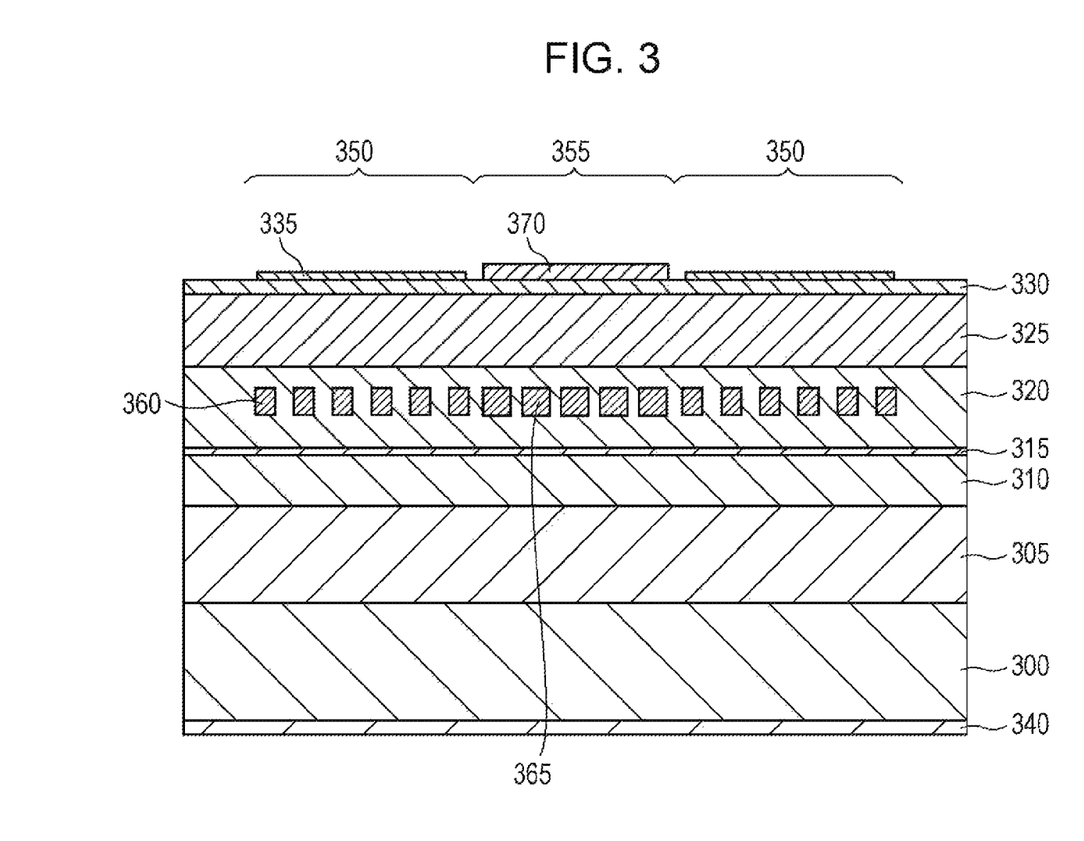
FIG. 3 is a cross-sectional view of a photonic crystal surface emitting laser according to a second example.

FIG. 3 is a schematic cross-sectional view for explaining a laser structure according to a second example. In contrast to the first example in which the radiation coefficient is varied by varying the depth of the holes, the radiation coefficient is varied by varying the radius of the holes in this example.

This example differs from the first example only in the configuration (thickness and hole radius) of the two-dimensional photonic crystals, but other configurations are the same as those in the first example.

The radius of holes in two-dimensional photonic crystals 360 in first photonic crystal regions 350 is 30 nm, whereas the radius of holes in a two-dimensional photonic crystal 365 in a second photonic crystal region 355 is 60 nm. The two-dimensional photonic crystals 360 and 365 both have a thickness of 100 nm.

Calculation results indicate that a coupling coefficient with respect to first-order diffraction in the two-dimensional photonic crystals 360 in the first photonic crystal regions 350 is 580 cm$^{-1}$ and that a coupling coefficient with respect to first-order diffraction in the two-dimensional photonic crystal 365 in the second photonic crystal region 355 is 1250 cm$^{-1}$.

In this example, the radiation coefficient of the second photonic crystal region 355 is larger than the radiation coefficient of the first photonic crystal regions 350, and the radius of the holes in the photonic crystal 365 is set such that the radiation coefficient of the second photonic crystal region 355 is as large as possible.

Similar to the first example, the light leaking from each first photonic crystal region 350 is prevented from reaching another neighboring first photonic crystal region 350 in this example, thereby allowing for stable laser oscillation.

Third Example

Figure 4:
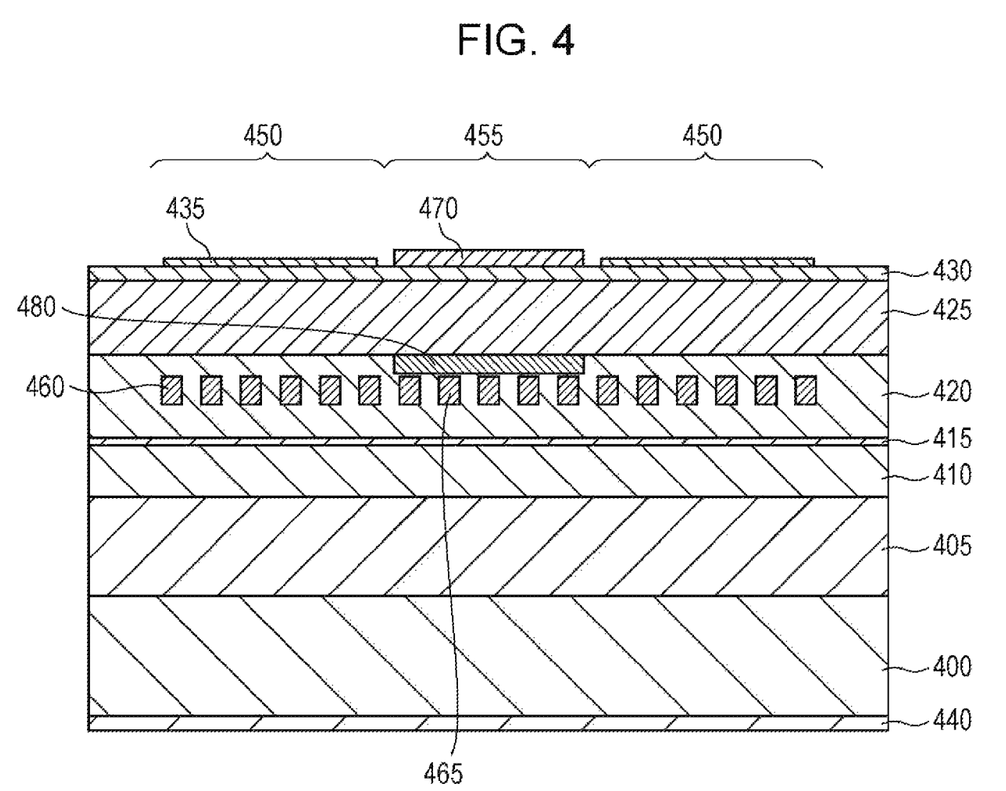
FIG. 4 is a cross-sectional view of a photonic crystal surface emitting laser according to a third example.

FIG. 4 is a schematic cross-sectional view for explaining a laser structure according to a third example. In this example, the radiation coefficient is varied by varying the configuration of a layer adjacent to a photonic crystal.

This example differs from the first example only in the configuration (thickness and hole radius) of the two-dimensional photonic crystals and the configuration of the adjacent layer, but other configurations are the same as those in the first example.

In this example, photonic crystals 460 in first photonic crystal regions 450 and a photonic crystal 465 in a second photonic crystal region 455 have the same structure. Specifically, the radius of holes is 30 nm, and the thickness of the photonic crystals is 80 nm.

A light intensity distribution control layer 480 composed of In$_{0.05}$Ga$_{0.95}$N is disposed above the photonic crystal 465 in the second photonic crystal region 455. Because the light intensity distribution control layer 480 has a refractive index that is larger than an average refractive index of the photonic crystal 465 and the refractive index of a surrounding p-GaN layer 420, the light intensity distribution control layer 480 has a function of raising the light intensity distribution upward. As a result, the light intensity distribution within the photonic crystals 460 in the thickness direction thereof is made more uniform.

The 80-nm thickness of the photonic crystals 460 and 465 is equivalent to 0.5 times a 160-nm lattice constant of the photonic crystals 460 and 465. As shown in FIG. 8, with this thickness of the photonic crystals 460 and 465, the radiation coefficient increases as the light intensity distribution within each photonic crystal in the thickness direction thereof is made more uniform.

Therefore, with the light intensity distribution control layer 480, the radiation coefficient of the second photonic crystal region 455 is set to be larger than that of the first photonic crystal regions 450.

Similar to the first example, the light leaking from each first photonic crystal region 450 is prevented from reaching another neighboring first photonic crystal region 450 in this example, thereby allowing for stable laser oscillation.

Fourth Example

Figure 5:
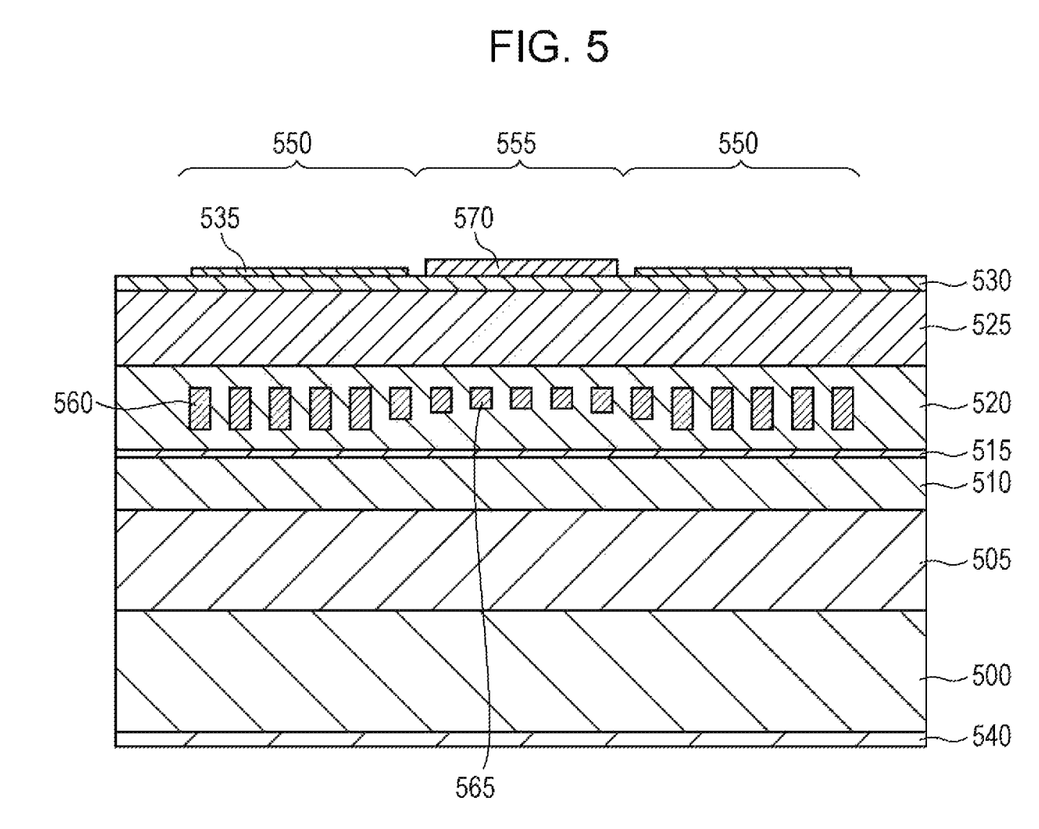
FIG. 5 is a cross-sectional view of a photonic crystal surface emitting laser according to a fourth example.

FIG. 5 is a schematic cross-sectional view for explaining a laser structure according to a fourth example.

In this example, the boundaries between the first photonic crystal regions and the second photonic crystal region are made smooth so as to reduce the occurrence of light reflection where the effective refractive index is non-continuous.

This example and the first example differ from each other only in whether the boundaries between the first photonic crystal regions and the second photonic crystal region change sharply or continuously. Other configurations of this example are the same as those of the first example.

In this example, a volume by which holes occupy a photonic crystal in each first photonic crystal region 550 is larger than that in a second photonic crystal region 555. Because a material embedded in the holes has a refractive index that is smaller than that of the surrounding area, an effective refractive index of each first photonic crystal region 550 is smaller than an effective refractive index of the second photonic crystal region 555. Although this mismatch of the refractive indices may cause light reflection to occur at the boundaries between the first photonic crystal regions 550 and the second photonic crystal region 555, the occurrence of light reflection may be reduced due to a smooth change in the refractive index at the boundaries. Specifically, by continuously varying the depth of the holes near the boundaries, as shown in FIG. 5, a sharp change in the effective refractive index may be prevented.

Similar to the first example, the light leaking from each first photonic crystal region 550 is prevented from reaching another neighboring first photonic crystal region 550 in this example, thereby allowing for stable laser oscillation. In addition, reflected feedback light may be reduced relative to the first example, thereby allowing for more stable laser oscillation.

Although the examples have been described above, the surface emitting laser according to the embodiments is not limited to the examples. The shape, material, and size of the photonic crystals, and the material used for forming the active layer, the cladding layers, and the electrodes may be appropriately changed within the scope of the disclosure.

Furthermore, although 405 nm is described as being a laser oscillation wavelength in the above examples, operation in a freely-chosen wavelength is also possible by selecting an appropriate material or structure.

The surface emitting laser according to the embodiments described above may also be used as a light source for rending an image on a photosensitive drum included in an image forming apparatus, such as a copier or a laser printer.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2011-095116 filed Apr. 21, 2011, which is hereby incorporated by reference herein in its entirety.

What is claimed is:

1. A surface emitting laser array comprising:
a plurality of first photonic crystals;
a second photonic crystal arranged between the first photonic crystals;
an active layer corresponding to the first photonic crystals;
a first electrode corresponding to one of first photonic crystals;
a second electrode corresponding to another of first photonic crystals and being different from the first electrode; and
a light absorber on the second photonic crystal and absorbing light of a wavelength $\lambda$,
wherein the first photonic crystals are arranged in an in-plane direction of the active layer,
wherein a first electrode and a second electrode are arranged in the in-plane direction,
wherein each of the first photonic crystals serves as a cavity of the wavelength $\lambda$ in the in-plane direction,
wherein the second photonic crystal causes light diffraction in an out-of-plane direction of the active layer,
wherein the light absorber absorbs light which includes the light of the wavelength and which is caused light diffraction by the second photonic crystal.

2. The surface emitting laser array according to claim 1, wherein a radiation coefficient of each of the first photonic crystal is smaller than a radiation coefficient of the second photonic crystal.

3. The surface emitting laser array according to claim 1, wherein each of the first photonic crystals and the second photonic crystal is formed of a layer and holes periodically provided in the layer.

4. The surface emitting laser array according to claim 3, wherein the radius of a hole in the first photonic crystal is smaller than a radius of a hole in the second photonic crystal.

5. The surface emitting laser array according to claim 3, wherein a radius of a hole in the second photonic crystal is a radius corresponding to a peak of coupling coefficient.

6. The surface emitting laser array according to claim 3, wherein a radius of a hole in the second photonic crystal is about 40% of a lattice constant of the second photonic crystal.

7. The surface emitting laser array according to claim 1, wherein a lattice constant of the first photonic crystal is identical with a lattice constant of the second photonic crystal.

8. The surface emitting laser array according to claim 1, wherein the first photonic crystals and the second photonic crystal are provided on the light emitting side with respect to the active layer.

9. The surface emitting laser array according to claim 1, further comprising a third electrode corresponding to the one of the first photonic crystals and arranged at an opposite side of a first electrode side with respect to the active layer.

10. The surface emitting laser array according to claim 9, wherein the third electrode corresponds to the another of the first photonic crystals and arranged at an opposite side of a second electrode side with respect to the active layer.

11. The surface emitting laser array according to claim 1, wherein the light absorber is not arranged on the first photonic crystals.

12. The surface emitting laser array according to claim 1 wherein the first photonic crystals comprise a diffraction grating of a second order or higher.

13. The surface emitting laser array according to claim 1 wherein there is no groove between the first and second photonic crystals.

14. An image forming apparatus comprising:
a photosensitive drum; and
a light source,
wherein the surface emitting laser array according to claim 1 is used as the light source.

15. The surface emitting laser array according to claim 1, wherein the first photonic crystals comprise a diffraction grating of an even-numbered.

16. The surface emitting laser array according to claim 1, wherein the first photonic crystals comprise a second-order diffraction grating.

17. The surface emitting laser array according to claim 1, wherein the second photonic crystal comprises a diffraction grating of a second order or higher.

18. The surface emitting laser array according to claim 16, wherein the second photonic crystal comprises a diffraction grating of a second order or higher.

19. The surface emitting laser array according to claim 1, wherein the light absorber is formed of a metal.

20. The surface emitting laser array according to claim 3, wherein a radius of a hole in the first photonic crystal is different from a radius of a hole in the second photonic crystal.

* * * * *